United States Patent
Lippincott (10) Patent No.: US 10,732,499 B2
(45) Date of Patent: Aug. 4, 2020

(54) METHOD AND SYSTEM FOR CROSS-TILE OPC CONSISTENCY

(71) Applicant: Mentor Graphics Corporation, Wilsonville, OR (US)

(72) Inventor: George P. Lippincott, Lake Oswego, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 16/195,953

(22) Filed: Nov. 20, 2018

(65) Prior Publication Data

US 2019/0155143 A1    May 23, 2019

Related U.S. Application Data

(60) Provisional application No. 62/590,118, filed on Nov. 22, 2017.

(51) Int. Cl.
*G06F 17/50*    (2006.01)
*G06F 30/398*    (2020.01)
*G03F 1/36*    (2012.01)

(52) U.S. Cl.
CPC .............. *G03F 1/36* (2013.01); *G06F 30/398* (2020.01)

(58) Field of Classification Search
USPC .......................................................... 716/53
See application file for complete search history.

(56) References Cited

U.S. PATENT DOCUMENTS

| | | | |
|---|---|---|---|
| 2008/0046846 A1* | 2/2008 | Chew .................. | G06F 17/5068 716/51 |
| 2009/0199151 A1* | 8/2009 | Banerjee .................. | G03F 1/36 716/53 |
| 2010/0122231 A1* | 5/2010 | Agarwal .................. | G03F 1/36 716/53 |
| 2015/0242555 A1* | 8/2015 | Wang .................. | G06F 17/5068 438/694 |
| 2018/0314148 A1* | 11/2018 | Tetiker ...................... | G03F 1/70 |

* cited by examiner

*Primary Examiner* — Mohammed Alam

(57) ABSTRACT

Aspects of the disclosed technology relate to techniques for achieving optical proximity correction cross-tile consistency. A layout design is divided into a plurality of regions. Optical proximity correction iterations are performed on each of the plurality of regions to generate a modified layout design. Based on the modified layout design and the layout pattern surrounding each of the edge fragments in the modified layout design, a final modified layout design is generated such that the edge fragments in different regions in the plurality of regions in the final modified layout design having the same layout pattern have a same edge adjustment value with respect to the layout design.

18 Claims, 6 Drawing Sheets

METHOD AND SYSTEM FOR CROSS-TILE OPC CONSISTENCY

RELATED APPLICATIONS

This application claims the benefit of U.S. Provisional Patent Application No. 62/590,118, filed on Nov. 22, 2017, and naming George P. Lippincott as inventors, which application is incorporated entirely herein by reference.

FIELD OF THE DISCLOSED TECHNOLOGY

The present disclosed technology relates to the field of circuit design and manufacture. Various implementations of the disclosed technology may be particularly useful for optical proximity correction of layout designs.

BACKGROUND OF THE DISCLOSED TECHNOLOGY

As designers and manufacturers continue to shrink the size of circuit components, the shapes reproduced on the substrate though photolithography become smaller and are placed closer together. This reduction in feature size and spacing increases the difficulty of faithfully reproducing the image intended by the design layout onto the substrate and can create flaws in the manufactured device. To address the problem, one or more resolution enhancement techniques are often employed to improve the resolution of the image that the mask forms on the substrate during the photolithographic process.

One of resolution enhancement techniques, "optical proximity correction" or "optical process correction" (OPC), tries to compensate for light diffraction effects. When light illuminates the photomask, the transmitted light diffracts, with light from regions with higher special frequencies diffracting at higher angles. The resolution limits of the lens in a photolithographic system make the lens act effectively as a low-pass filter for the various spatial frequencies in the two-dimensional layout. This can lead to optical proximity effects such as a pull-back of line-ends from their desired position, corner rounding, and a bias between isolated and dense structures. The optical proximity correction adjusts the amplitude of the light transmitted through a lithographic mask by modifying the layout design data employed to create the photomask. For example, edges in the layout design may be adjusted to make certain portions of the geometric elements larger or smaller, in accordance with how much additional light exposure (or lack of exposure) is desired at certain points on the substrate. When these adjustments are appropriately calibrated, overall pattern fidelity is greatly improved, reducing optical proximity effects.

Numerical noise caused by computation in an optical proximity correction process can lead to different corrections for the same layout pattern in different locations. While the deviations are usually small, it is desirable for an optical proximity correction tool to produce a consistent result for the same layout patterns, which is particularly true for designs with repetitive patterns such as memory cells.

BRIEF SUMMARY OF THE DISCLOSED TECHNOLOGY

Aspects of the disclosed technology relate to techniques for achieving optical proximity correction cross-tile consistency. In one aspect, there is a method comprising: receiving a layout design, the layout design being divided into a plurality of regions; performing a plurality of optical proximity correction iterations on each of the plurality of regions to generate a modified layout design, each of the plurality of optical proximity correction iterations comprising: performing simulation to determine edge placement errors for the edge fragments in the each of the plurality of regions, determining intermediate edge adjustment values for the edge fragments in the each of the plurality of regions based on the edge placement errors and a layout pattern in a predetermined-size area surrounding each of the edge fragments such that edge fragments in each of the plurality of regions having the same layout pattern have the same intermediate edge adjustment value, and generating, based on the intermediate edge adjustment values, a modified layout region for the each of the plurality of regions for a next optical proximity correction iteration; generating a final modified layout design, which is to be used for photomask manufacture, based on the modified layout design and the layout pattern surrounding each of the edge fragments in the modified layout design such that the edge fragments in different regions in the plurality of regions in the final modified layout design having the same layout pattern have a same edge adjustment value with respect to the layout design; and storing information of the final modified layout design.

The method may further comprise: processing the final modified layout design to generate mask data for a mask-writing tool to make photomasks. The method may still further comprise: applying the mask data to the mask-writing tool to create photomasks.

The same edge adjustment value may be an average value of edge adjustment values for the edge fragments in different regions in the plurality of regions but having the same layout pattern. The average value may be a weighted average value based on a number of the edge fragments having the same layout pattern in each of the plurality of regions. The plurality of regions comprise rectangular or square areas.

In another aspect, there is one or more computer-readable media storing computer-executable instructions for causing one or more processors to perform the above method.

In still another aspect, there is a system, comprising: one or more processors, the one or more processors programmed to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNOLOGY

General Considerations

Various aspects of the present disclosed technology relate to techniques for achieving optical proximity correction cross-tile consistency. In the following description, numerous details are set forth for the purpose of explanation. However, one of ordinary skill in the art will realize that the disclosed technology may be practiced without the use of these specific details. In other instances, well-known features have not been described in detail to avoid obscuring the present disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "perform", "generate," and "determine" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one micro device, such as data to be used to form multiple micro devices on a single wafer.

Illustrative Operating Environment

The execution of various electronic design automation processes according to embodiments of the disclosed technology may be implemented using computer-executable software instructions executed by one or more programmable computing devices. Because these embodiments of the disclosed technology may be implemented using software instructions, the components and operation of a generic programmable computer system on which various embodiments of the disclosed technology may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the disclosed technology.

Figure 1:
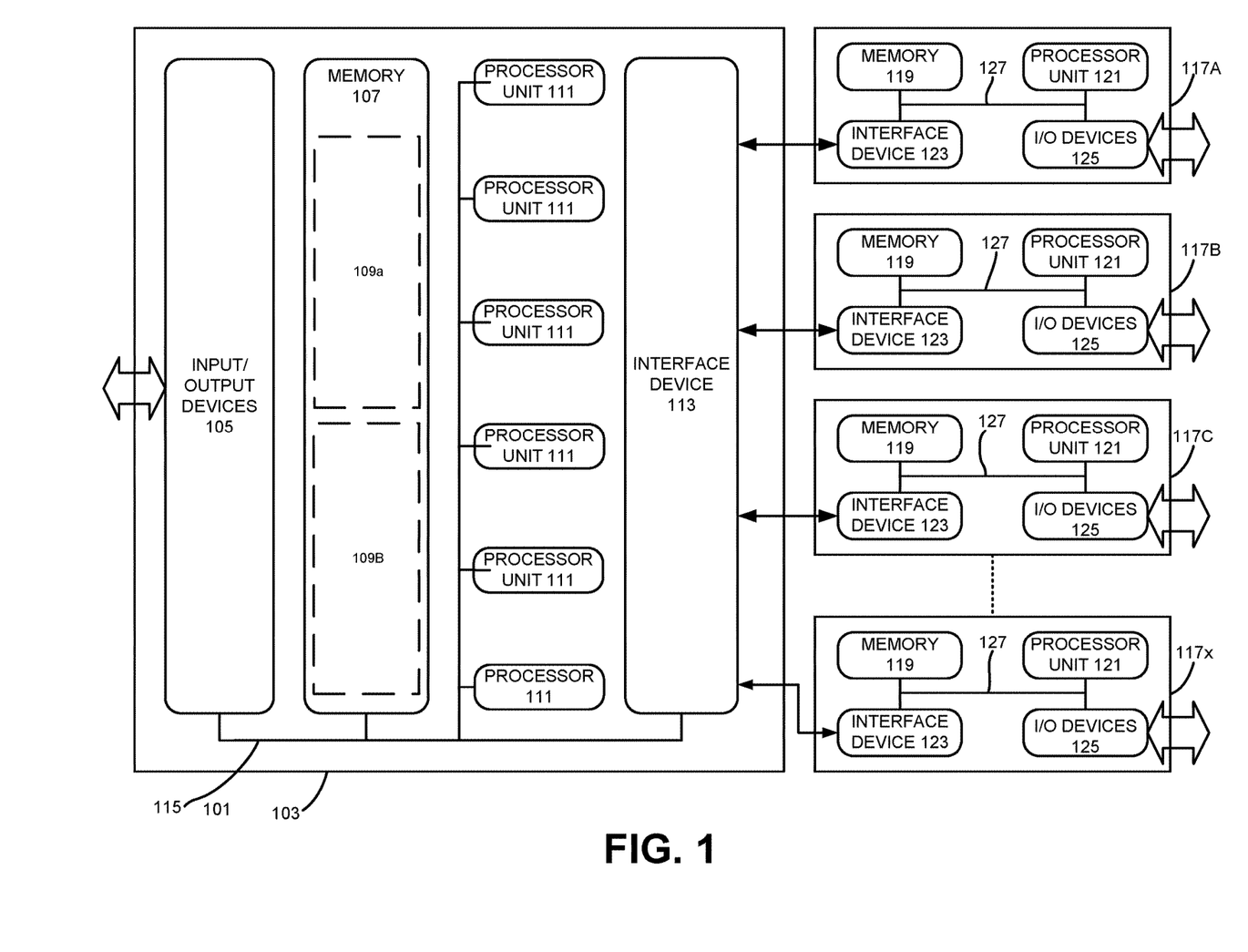
FIG. 1 illustrates an example of a computing system that may be used to implement various embodiments of the disclosed technology.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the disclosed technology. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
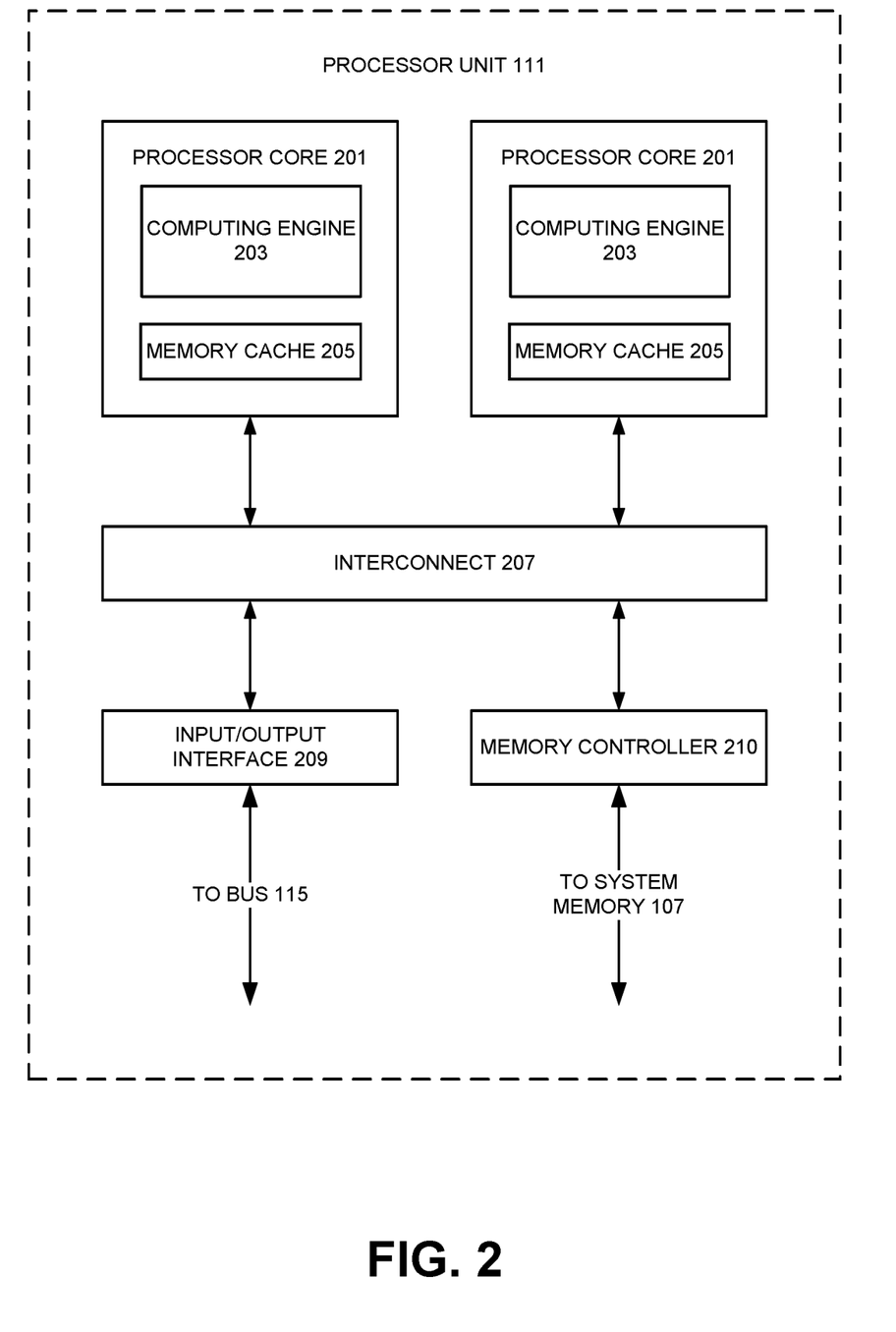
FIG. 2 illustrates an example of a multi-core processor unit that may be used to implement various embodiments of the disclosed technology.

With some implementations of the disclosed technology, the master computing device 103 may employ one or more processing units 111 having more than one processor core. Accordingly, FIG. 2 illustrates an example of a multi-core processor unit 111 that may be employed with various embodiments of the disclosed technology. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the disclosed technology, the processor units 111 may include additional components, such as a high-level cache memory accessible shared by the processor cores 201.

While FIG. 2 shows one illustration of a processor unit 111 that may be employed by some embodiments of the disclosed technology, it should be appreciated that this illustration is representative only, and is not intended to be limiting. Also, with some implementations, a multi-core processor unit 111 can be used in lieu of multiple, separate processor units 111. For example, rather than employing six separate processor units 111, an alternate implementation of the disclosed technology may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the disclosed technology, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the disclosed technology may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the disclosed technology, either the computer 103, one or more of the servant computers 117, or some combination of both may use two or more different interface devices 113 or 123 for communicating over multiple communication interfaces.

With various examples of the disclosed technology, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the disclosed technology, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the disclosed technology.

Circuit Design Flow and Optical Proximity Correction

Electronic circuits, such as integrated microcircuits, are used in a variety of products, from automobiles to microwaves to personal computers. Designing and fabricating integrated circuit devices typically involves many steps, sometimes referred to as a "design flow." The particular steps of a design flow often are dependent upon the type of integrated circuit, its complexity, the design team, and the integrated circuit fabricator or foundry that will manufacture the microcircuit. Typically, software and hardware "tools" verify the design at various stages of the design flow by running software simulators and/or hardware emulators. These steps aid in the discovery of errors in the design, and allow the designers and engineers to correct or otherwise improve the design.

Several steps are common to most design flows. Initially, the specification for a new circuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This device design generally corresponds to the level of representation displayed in conventional circuit diagrams. The relationships between the electronic devices are then analyzed, to confirm that the circuit described by the device design will correctly perform the desired functions. This analysis is sometimes referred to as "formal verification." Additionally, preliminary timing estimates for portions of the circuit are often made at this stage, using an assumed characteristic speed for each device, and incorporated into the verification process.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, automated place and route tools will be used to define the physical layouts, especially of wires that will be used to interconnect the circuit devices. Each layer of the microcircuit will have a corresponding layer representation in the layout design, and the geometric shapes described in a layer representation will define the relative locations of the circuit elements that will make up the circuit device. For example, shapes in the layer representation of a metal layer will define the locations of the metal wires used to connect the circuit devices. Custom layout editors, such as Mentor Graphics' IC Station or Cadence's Virtuoso, allow a designer to custom design the layout, which is mainly used for analog, mixed-signal, RF, and standard-cell designs.

Integrated circuit layout descriptions can be provided in many different formats. The Graphic Data System II (GDSII) format is a popular format for transferring and archiving two-dimensional graphical IC layout data. Among other features, it contains a hierarchy of structures, each structure containing layout elements (e.g., polygons, paths or polylines, circles and textboxes). Other formats include an open source format named Open Access, Milkyway by Synopsys, Inc., EDDM by Mentor Graphics, Inc., and the more recent Open Artwork System Interchange Standard (OASIS) proposed by Semiconductor Equipment and Materials International (SEMI). These various industry formats are used to define the geometrical information in IC layout designs that are employed to manufacture integrated circuits. Once the microcircuit device design is finalized, the layout portion of the design can be used by fabrication tools to manufacture the device using a photolithographic process.

Typically, a designer will perform a number of verification processes on the layout design. For example, the layout design may be analyzed to confirm that it accurately represents the circuit devices and their relationships described in the device design. In this process, a LVS (layout versus schematic) tool extracts a netlist from the layout design and compares it with the netlist taken from the circuit schematic. LVS can be augmented by formal equivalence checking, which checks whether two circuits perform exactly the same function without demanding isomorphism.

The layout design also may be analyzed to confirm that it complies with various design requirements, such as minimum spacings between geometric elements and minimum linewidths of geometric elements. In this process, a DRC (design rule checking) tool takes as input a layout in the GDSII standard format and a list of rules specific to the semiconductor process chosen for fabrication. A set of rules for a particular process is referred to as a run-set, rule deck, or just a deck. An example of the format of a rule deck is the Standard Verification Rule Format (SVRF) by Mentor Graphics Corporation.

There are many different fabrication processes for manufacturing a circuit, but most processes include a series of steps that deposit layers of different materials on a substrate, expose specific portions of each layer to radiation, and then etch the exposed (or non-exposed) portions of the layer away. For example, a simple semiconductor device component could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, and the exposed areas are etched away, leaving behind exposed areas on the epitaxial layer, (i.e., areas no longer covered by the nitride layer). The exposed areas then are subjected to a diffusion or ion implantation process, causing dopants, for example phosphorus, to enter the exposed epitaxial layer and form charged wells. This process of depositing layers of material on the substrate or subsequent material layers, and then exposing specific patterns to radiation, etching, and dopants or other diffusion materials, is repeated a number of times, allowing the different physical layers of the circuit to be manufactured.

Each time that a layer of material is exposed to radiation, a mask must be created to expose only the desired areas to the radiation, and to protect the other areas from exposure. The mask is created from circuit layout data. That is, the geometric elements described in a design layout define the relative locations or areas of the circuit that will be exposed to radiation through the mask. A mask or reticle writing tool is used to create the mask based upon the design layout, after which the mask can be used in a photolithographic process.

As discussed previously, one or more resolution enhancement techniques (RETs) are often employed to improve the resolution of the image that the mask forms on the substrate during the photolithographic process. One of these techniques is optical proximity correction (OPC). OPC can be rule-based, model-based, or both. In rule-based OPC, the proximity effects are characterized and specific solutions are devised for specific geometric configurations. The layout design is then searched using a DRC tool or a geometric-based software engine to find these geometric configurations. Once they are found, the specific solutions are applied.

Figure 3A:
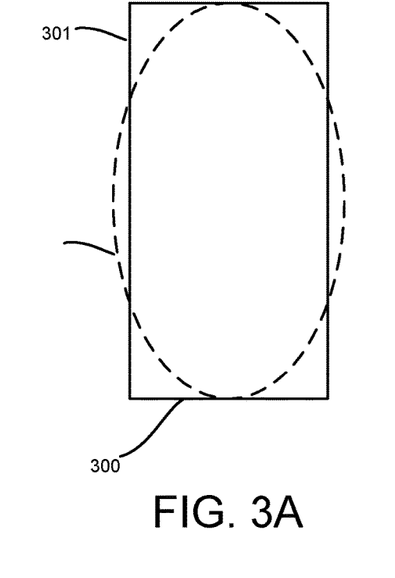
FIG. 3A illustrates a mask feature 300 and a simulated image of the mask feature.
Figure 3B:
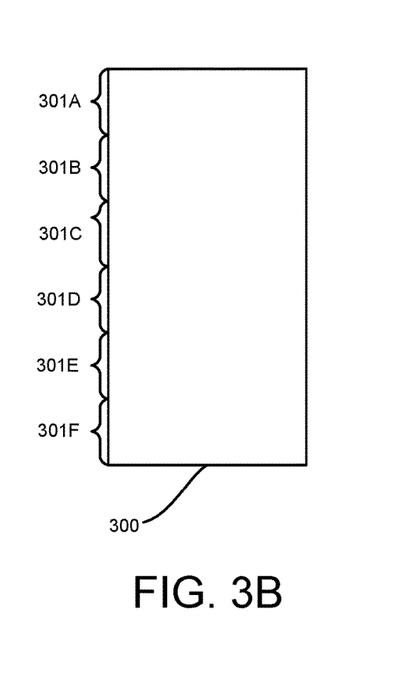
FIG. 3B illustrates an example of fragmentation of an edge of the mask feature 300.
Figure 3C:
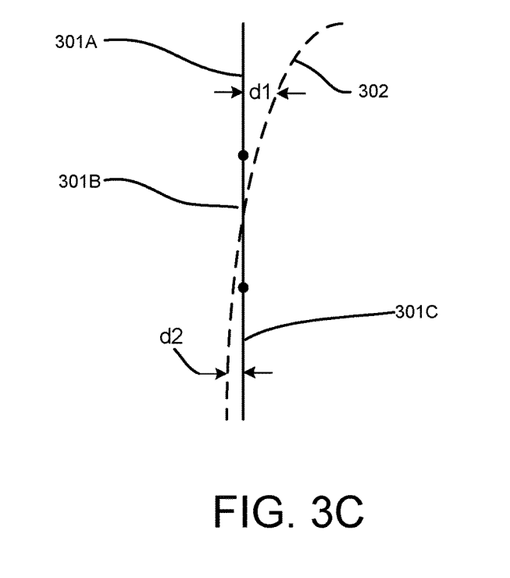
FIG. 3C illustrates edge displacement errors for some of the edge fragments.

Rule-based OPC approaches work well for simple cases. For complex layout features, however, model-based OPC approaches must be employed to obtain desired results. Model-based OPC performs simulation to predict the printed image, which guides layout modifications. In a typical model-based OPC process, polygons in the layout design are divided into edge fragments to allow the desired fine motion of edge fragments. FIGS. 3A-3D illustrates an example. An edge 301 of a layout feature 300 in FIG. 3A may be fragmented into edge fragments 301A-301F as shown in FIG. 3B. The size of the edge fragments and which particular edges are to be fragmented in a given layout design depends upon the OPC process parameters, often referred to as the OPC recipe. While not all edges within a layout design are fragmented in every OPC process, these edges may also be referred to as edge fragments. Simulation is performed to obtain the predicted printed image 302 for the layout feature 300 shown in FIG. 3A. This simulated image is compared to the target image. Typically, this comparison is done at each edge fragment. For example, as shown in FIG. 3C, the target image is a distance d1 away from the simulated image at the edge fragment 301A, the target image is a distance d2 away from the simulated image at the edge fragment 301C, while the target image intersects the simulated image at the edge fragment 301B. The distances between the target image and the simulated image are often referred to as edge placement error (EPE).

Figure 3D:
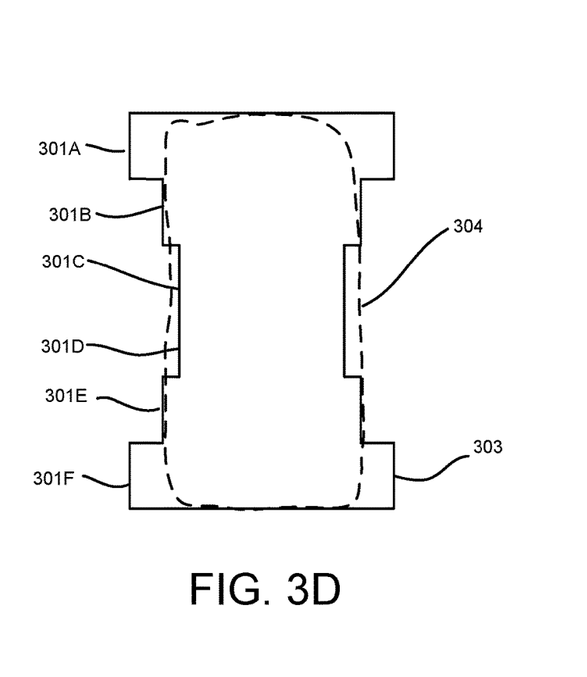
FIG. 3D illustrates a mask feature modified from the mask feature 300 by an OPC process and a corresponding simulated image.

Next, the edge fragments are individually moved or adjusted in order to enable the simulated image for the resulting mask to reproduce the target image as much as possible. For example, as shown in FIG. 3D, the edge fragment 301A is displaced in a direction away from the geometric element 301, in an effort to widen the corresponding portion of the image that would be produced by the resulting mask. Similarly, the edge fragment 301C is displaced in a direction toward from the geometric element 301, in an effort to narrow the corresponding portion of the image that would be produced by the resulting mask. Next, the image that would be produced by a mask using the displaced edge fragments is simulated, and the new simulated image is compared with the target image, and the edge placement error for each edge fragment is computed.

This process of moving the edge fragments, simulating the image that would be produced using the moved edge fragments, and comparing the simulated image to the target image may be repeated a number of times. Each cycle of moving edge fragments and comparing the new simulated image to target image is referred to as an iteration of the OPC process. Typically, edge fragments moved during a given iteration, and the distance the edge fragments are displaced, are determined based upon the edge placement error. For example, because d1 is larger than d2 in FIG. 3C, a subsequent iteration of the optical proximity correction process may move edge fragment 301A a greater amount than edge fragment 301C.

The movement value for each edge fragment, often referred to as edge adjustment values or edge displacement values, may be the edge placement error multiplied by a constant factor (feedback factor). This feedback factor may be location dependent or edge type dependent based on the OPC recipe. Methods that consider correlations between neighboring edge fragments such as those described in U.S. patent Ser. Nos. 14/183,209 and 14/183,228, which are incorporated herein by reference, may also be employed to derive the movement value (referred to as cross-MEEF (mask error enhancement factor)-based methods).

The OPC iteration process continues until the simulated image is sufficiently similar to the target image (e.g., both d1 and d2 are smaller than a threshold value), or until it is determined that the displacements of the edge fragments already have converged on locations where no further movement of the edge fragments will improve the simulated image. Once the final positions of the edge fragments are determined in the layout design data, as shown in FIG. 3D, a modified mask feature 303 can be created from the corrected layout design data. As shown in FIG. 3D, the image 304 produced by the modified mask feature 303 should more closely correspond to the target image.

While OPC based on modifying geometric shapes can certainly correct many proximity effects, it does not address one proximity effect—the iso-dense bias problem caused by variations in focus condition. The variations in focus condition become significant when an off-axis illumination scheme (one of the three major resolution enhancement technologies) is optimized for greatest depth of focus of densely placed features. Sub-resolution assist features (SRAFs) can be inserted into the layout design to provide a dense-like environment for isolated features. SRAFs, sometimes also known as "scattered bars," are sub-resolution features not meant to print. They must be carefully adjusted in size and position so that they never print over the needed process window. This determines the most important trade-off in SRAF generation and placement: making the assist features as large and dense as possible in order to create a more dense-like mask pattern, but not so large or dense that they print. Just like the edge-adjustment-based OPC approach, there are rule-based SRAF and model-based SRAF methods. The SRAF insertion is typically performed before or during the edge-adjustment-based OPC process.

Optical Proximity Correction Tool

Figure 4:
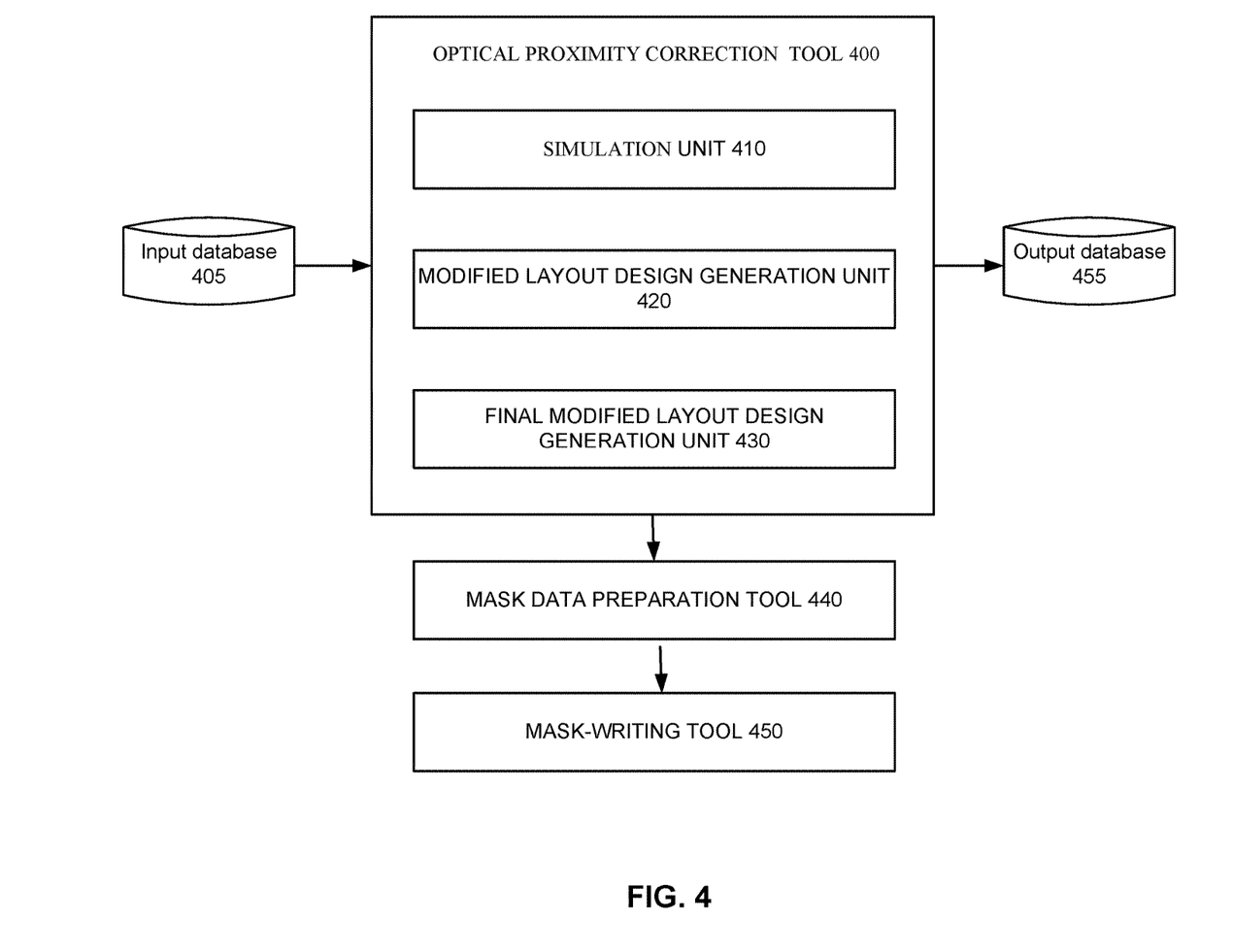
FIG. 4 illustrates an example of an optical proximity correction tool according to various embodiments of the disclosed technology.

FIG. 4 illustrates an example of an optical proximity correction tool 400 that may be implemented according to various embodiments of the disclosed technology. As seen in this figure, the optical proximity correction tool 400 includes a simulation unit 410, a modified layout design generation unit 420, and a final modified layout design generation unit 430. Some implementations of the optical proximity correction tool 400 may cooperate with (or incorporate) one or more of a mask data preparation tool 440, a mask-writing tool 450, an input database 405 and an output database 455.

As will be discussed in more detail below, the optical proximity correction tool 400 receives a layout design from the input database 305. The layout design is divided into a plurality of regions. The modified layout design generation unit 420 performs a plurality of optical proximity correction iterations on each of the plurality of regions to generate a modified layout design. Each of the plurality of optical proximity correction iterations comprises: using the simulation unit 410 to perform simulation to determine edge placement errors for the edge fragments in the each of the plurality of regions, determining intermediate edge adjustment values for the edge fragments in the each of the plurality of regions based on the edge placement errors and a layout pattern in a predetermined-size area surrounding each of the edge fragments such that edge fragments in each of the plurality of regions having the same layout pattern have the same intermediate edge adjustment value, and generating, based on the intermediate edge adjustment values, a modified layout region for the each of the plurality of regions for a next optical proximity correction iteration. The final modified layout design generation unit 430 generates a final modified layout design, which is to be used for photomask manufacture, based on edge placement errors for the edge fragments in the modified layout design and the layout pattern surrounding each of the edge fragments in the modified layout design such that the edge fragments in different regions in the plurality of regions in the final modified layout design having the same layout pattern have a same edge adjustment value with respect to the layout design. The optical proximity correction tool 400 stores information of the final modified layout design in the output database 455. The mask data preparation tool 440 can process the final modified layout design to generate mask data. The mask-writing tool 450 can use the mask data to make photomasks.

As previously noted, various examples of the disclosed technology may be implemented by one or more computing systems, such as the computing system illustrated in FIGS. 1 and 2. Accordingly, one or more of the simulation unit 410, the modified layout design generation unit 420, the final modified layout design generation unit 430 and the mask data preparation tool 440 may be implemented by executing programming instructions on one or more processors in one or more computing systems, such as the computing system illustrated in FIGS. 1 and 2. Correspondingly, some other embodiments of the disclosed technology may be implemented by software instructions, stored on a non-transitory computer-readable medium, for instructing one or more programmable computers/computer systems to perform the functions of one or more of the simulation unit 410, the modified layout design generation unit 420, the final modified layout design generation unit 430 and the mask data preparation tool 440. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, or a solid state storage device.

It also should be appreciated that, while the simulation unit 410, the modified layout design generation unit 420, the final modified layout design generation unit 430 and the mask data preparation tool 440 are shown as separate units in FIG. 4, a single computer (or a single processor within a master computer) or a single computer system may be used to implement some or all of these units at different times, or components of these units at different times.

With various examples of the disclosed technology, the input database 405 and the output database 455 may be implemented using any suitable computer readable storage device. That is, either of the input database 405 and the output database 455 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, holographic storage devices, or any other non-transitory storage medium that can be used to store desired information. While the input database 405 and the output database 455 are shown as separate units in FIG. 4, a single data storage medium may be used to implement some or all of these databases.

Cross-Tile Consistent OPC

Figure 5:
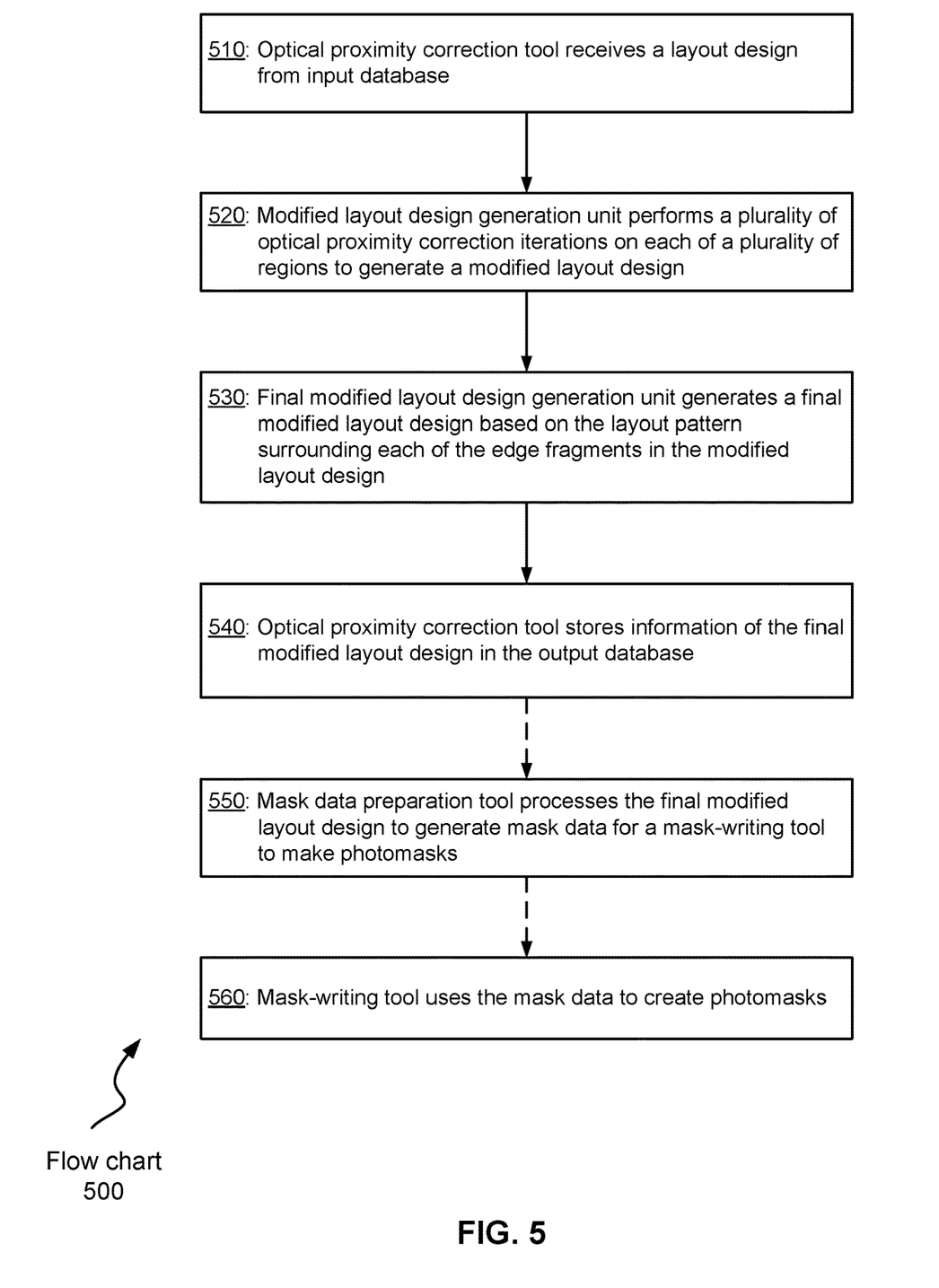
FIG. 5 illustrates a flowchart showing a process of optical proximity correction that may be implemented according to various examples of the disclosed technology.

FIG. 5 illustrates a flowchart 500 showing a process of optical proximity correction that may be implemented according to various examples of the disclosed technology. For ease of understanding, methods of optical proximity correction that may be employed according to various embodiments of the disclosed technology will be described with reference to the optical proximity correction tool 400 in FIG. 4 and the flow chart 500 illustrated in FIG. 5. It should be appreciated, however, that alternate implementations of an optical proximity correction tool may be used to perform the methods of optical proximity correction illustrated by the flow chart 500 according to various embodiments of the disclosed technology. Likewise, the optical proximity correction tool 400 may be employed to perform other methods of optical proximity correction according to various embodiments of the disclosed technology.

In operation 510 of the flow chart 500, the optical proximity correction tool 400 receives a layout design from the input database 405. The layout design, derived from a circuit design, may be in the GDSII standard format. The layout design can be one for a whole chip or a portion of a full-chip layout design. The layout design is divided into a plurality of regions. The plurality of regions may be array of rectangle or square regions. Alternatively, the plurality of regions may include different shapes of regions. The size may be several μm or ten μm. These regions are sometimes referred to as tiles or windows.

Figure 6:
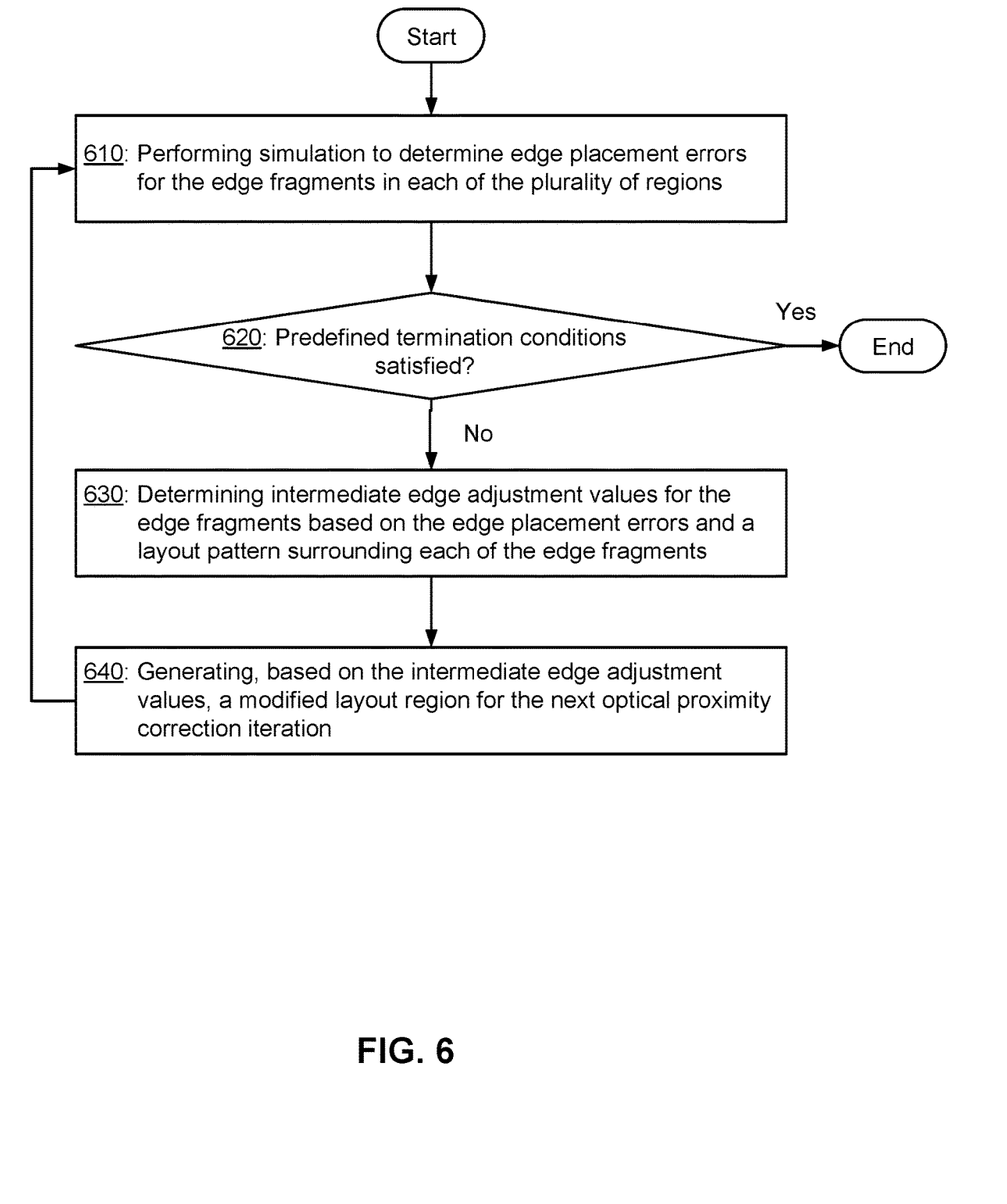
FIG. 6 illustrates an example of optical proximity iterations according to various examples of the disclosed technology.

In operation 520, the modified layout design generation unit 420 performs a plurality of optical proximity correction iterations on each of the plurality of regions to generate a modified layout design. As discussed previously, optical proximity correction is usually an iterative process. FIG. 6 illustrates an example of each of the plurality of optical proximity correction iterations according to various embodiments of the disclosed technology. In operation 610, the simulation unit 410 simulates the lithographic process that will be used to manufacture the integrated circuit to determine edge placement errors for the edge fragments in a tile. The edge placement errors indicate how far away the simulated printed image are from the intended printed image.

In operation 620, the modified layout design generation unit 420 determines whether the edge placement errors are within a predetermined range(s) or whether the number of optical proximity correction iterations has reached a predetermined number. If the answer is yes, the modified layout design generation unit 420 exits the iterations. If the answer is no, the modified layout design generation unit 420 determines, in operation 630, intermediate edge adjustment values for the edge fragments in the region based on the edge placement errors and a layout pattern in a predetermined-size area surrounding each of the edge fragments such that edge fragments in the region having the same layout pattern have the same intermediate edge adjustment value. As noted previously, the edge adjustment values may be obtained by multiplying the edge placement error by a constant factor (feedback factor). To maintain OPC consistency within each region, the edge fragments in the same layout pattern should have the same intermediate edge adjustment value. A DRC tool or a geometric-based software engine such as a pattern matching tool may be employed to identify instances of the same pattern in a region. Different edge adjustment values may be averaged to obtain the intermediate edge adjustment value for all instances of the same layout pattern. In operation 640, the modified layout design generation unit 420 adjusted the edge fragments based on the intermediate edge adjustment values to generate a modified layout region for the next optical proximity correction iteration. The simulation unit 410 and/or the modified layout design generation unit 420 can be implemented based on a commercial OPC tool, such as those in the Calibre family of software tools available from Mentor Graphics Corporation, Wilsonville, Oreg.

Refer back to the flowchart 500. In operation 530, the final modified layout design generation unit 430 generates a final modified layout design based on the modified layout design and the layout pattern surrounding each of the edge fragments in the modified layout design such that the edge fragments in different regions in the plurality of regions in the final modified layout design having the same layout pattern have the same edge adjustment value with respect to the layout design. The operation 520 ensures the consistency of OPC for edge fragments surrounded by the same layout pattern within a particular region. The operation 530 tries to achieve the consistency of OPC for edge fragments surrounded by the same layout pattern across different regions. Such consistency is desirable especially by memory chip designers and manufacturers. One approach to find a common edge adjustment value the whole layout design is to average the edge adjustment values (position differences between the modified layout design and the original layout design). The averaging can be simply unweighted or weighted. In a weighted approach, the weights may be dependent upon the frequency of a particular pattern occurring in a particular layout region. The higher the number of the instances of a particular layout pattern in a particular layout region, the larger the weight value for the particular layout region. After the final edge adjustment values are obtained, the final modified layout design generation unit 430 can adjust the layout design based on the final edge adjustment values to obtain the final modified layout design.

In operation 540, the optical proximity correction tool 400 stores information of the final modified layout design in the output database 455.

Optionally, in operation 550, the mask data preparation tool 440 processes the final modified layout design to generate mask data for a mask-writing tool to make photomasks. The mask-writing tool can be raster scan-based—either electron beams or laser beams constantly scan in a predetermined pattern. In this approach, the mask data preparation tool 440 converts the layout data into primitive shapes (rectangles and trapezoids), which is sometimes referred to as mask data fracturing. Alternatively, the mask-writing tool can use a variable-shaped beam—a larger beam is shaped by an aperture into a primitive shape (usually a rectangle or a trapezoid), and the image of the aperture is projected in individual "flashes" at appropriate locations. For this approach, the mask data preparation tool 440 fractures the layout design into shots of acceptable size and the appropriate stage motion instructions for creating the pattern. Additionally, the mask data preparation tool 440 may perform mask process correction (MPC). Although the photomask features are typically used in a 4× reduction system, and the feature dimensions are thus 4$x$ larger than on the wafer, there is still need to accurately fabricate SRAF and other OPC jogs and structures that are significantly smaller. Mask process correction attempts to correct charged particle proximity effects.

Still optionally, in operation 560, the mask-writing tool 450 uses the mask data to create photomasks. The photomasks can be used to fabricate chips through photolithography.

CONCLUSION

While the disclosed technology has been described with respect to specific examples including presently preferred modes of carrying out the disclosed technology, those skilled in the art will appreciate that there are numerous variations and permutations of the above described systems and techniques that fall within the spirit and scope of the disclosed technology as set forth in the appended claims. For example, while specific terminology has been employed above to refer to electronic design automation processes, it should be appreciated that various examples of the disclosed technology may be implemented using any desired combination of electronic design automation processes.

What is claimed is:

1. A method, executed by at least one processor of a computer, comprising:
   receiving a layout design, the layout design being divided into a plurality of regions;
   performing a plurality of optical proximity correction iterations on each of the plurality of regions to generate a modified layout design, each of the plurality of optical proximity correction iterations comprising:
     performing simulation to determine edge placement errors for the edge fragments in the each of the plurality of regions,
     determining intermediate edge adjustment values for the edge fragments in the each of the plurality of regions based on the edge placement errors and a layout pattern in a predetermined-size area surrounding each of the edge fragments such that edge fragments in each of the plurality of regions having the same layout pattern have the same intermediate edge adjustment value, and
     generating, based on the intermediate edge adjustment values, a modified layout region for the each of the plurality of regions for a next optical proximity correction iteration in the plurality of optical proximity correction iterations after the each of the plurality of optical proximity correction iterations;
   generating a final modified layout design, which is to be used for photomask manufacture, based on the modified layout design and the layout pattern surrounding each of the edge fragments in the modified layout design such that the edge fragments in different regions in the plurality of regions in the final modified layout design having the same layout pattern have a same edge adjustment value with respect to the layout design; and
storing information of the final modified layout design.

2. The method recited in claim 1, further comprising:
processing the final modified layout design to generate mask data for a mask-writing tool to make photomasks.

3. The method recited in claim 2, further comprising:
applying the mask data to the mask-writing tool to create photomasks.

4. The method recited in claim 1, wherein the same edge adjustment value is an average value of edge adjustment values for the edge fragments in different regions in the plurality of regions but having the same layout pattern.

5. The method recited in claim 4, wherein the average value is a weighted average value based on a number of the edge fragments having the same layout pattern in each of the plurality of regions.

6. The method recited in claim 1, wherein the plurality of regions comprise rectangular or square areas.

7. One or more non-transitory computer-readable media storing computer-executable instructions for causing one or more processors to perform a method, the method comprising:
receiving a layout design, the layout design being divided into a plurality of regions;
performing a plurality of optical proximity correction iterations on each of the plurality of regions to generate a modified layout design, each of the plurality of optical proximity correction iterations comprising:
performing simulation to determine edge placement errors for the edge fragments in the each of the plurality of regions,
determining intermediate edge adjustment values for the edge fragments in the each of the plurality of regions based on the edge placement errors and a layout pattern in a predetermined-size area surrounding each of the edge fragments such that edge fragments in each of the plurality of regions having the same layout pattern have the same intermediate edge adjustment value, and
generating, based on the intermediate edge adjustment values, a modified layout region for the each of the plurality of regions for a next optical proximity correction iteration in the plurality of optical proximity correction iterations after the each of the plurality of optical proximity correction iterations;
generating a final modified layout design, which is to be used for photomask manufacture, based on the modified layout design and the layout pattern surrounding each of the edge fragments in the modified layout design such that the edge fragments in different regions in the plurality of regions in the final modified layout design having the same layout pattern have a same edge adjustment value with respect to the layout design; and
storing information of the final modified layout design.

8. The one or more non-transitory computer-readable media recited in claim 7, wherein the method further comprises: processing the final modified layout design to generate mask data for a mask-writing tool to make photomasks.

9. The one or more non-transitory computer-readable media recited in claim 8, wherein the method further comprises: applying the mask data to the mask-writing tool to create photomasks.

10. The one or more non-transitory computer-readable media recited in claim 7, wherein the same edge adjustment value is an average value of edge adjustment values for the edge fragments in different regions in the plurality of regions but having the same layout pattern.

11. The one or more non-transitory computer-readable media recited in claim 10, wherein the average value is a weighted average value based on a number of the edge fragments having the same layout pattern in each of the plurality of regions.

12. The one or more non-transitory computer-readable media recited in claim 7, wherein the plurality of regions comprise rectangular or square areas.

13. A system, comprising:
one or more processors, the one or more processors programmed to perform a method, the method comprising:
receiving a layout design, the layout design being divided into a plurality of regions;
performing a plurality of optical proximity correction iterations on each of the plurality of regions to generate a modified layout design, each of the plurality of optical proximity correction iterations comprising:
performing simulation to determine edge placement errors for the edge fragments in the each of the plurality of regions,
determining intermediate edge adjustment values for the edge fragments in the each of the plurality of regions based on the edge placement errors and a layout pattern in a predetermined-size area surrounding each of the edge fragments such that edge fragments in each of the plurality of regions having the same layout pattern have the same intermediate edge adjustment value, and
generating, based on the intermediate edge adjustment values, a modified layout region for the each of the plurality of regions for a next optical proximity correction iteration in the plurality of optical proximity correction iterations after the each of the plurality of optical proximity correction iterations;
generating a final modified layout design, which is to be used for photomask manufacture, based on the modified layout design and the layout pattern surrounding each of the edge fragments in the modified layout design such that the edge fragments in different regions in the plurality of regions in the final modified layout design having the same layout pattern have a same edge adjustment value with respect to the layout design; and
storing information of the final modified layout design.

14. The system recited in claim 13, wherein the method further comprises: processing the final modified layout design to generate mask data for a mask-writing tool to make photomasks.

15. The system recited in claim 14, wherein the method further comprises: applying the mask data to the mask-writing tool to create photomasks.

16. The system recited in claim 13, wherein the same edge adjustment value is an average value of edge adjustment values for the edge fragments in different regions in the plurality of regions but having the same layout pattern.

17. The system recited in claim 16, wherein the average value is a weighted average value based on a number of the edge fragments having the same layout pattern in each of the plurality of regions.

18. The system recited in claim 13, wherein the plurality of regions comprise rectangular or square areas.

* * * * *